United States Patent
Camacho et al.

(10) Patent No.: US 8,120,149 B2
(45) Date of Patent: Feb. 21, 2012

(54) INTEGRATED CIRCUIT PACKAGE SYSTEM

(75) Inventors: Zigmund Ramirez Camacho, Singapore (SG); Henry D. Bathan, Singapore (SG); Arnel Trasporto, Singapore (SG); Jeffrey D. Punzalan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 521 days.

(21) Appl. No.: 11/307,128

(22) Filed: Jan. 24, 2006

(65) Prior Publication Data

US 2007/0170559 A1 Jul. 26, 2007

(51) Int. Cl.
*H01L 23/495* (2006.01)
*H01L 21/82* (2006.01)

(52) U.S. Cl. .................. 257/676; 438/123
(58) Field of Classification Search .............. 257/778, 257/676, 779; 438/123, 108, 119
See application file for complete search history.

(56) References Cited

U.S. PATENT DOCUMENTS

| | | | |
|---|---|---|---|
| 5,299,729 A * | 4/1994 | Matsushita et al. ...... 228/180.22 |
| 6,194,781 B1 * | 2/2001 | Ikegami ..................... 257/737 |
| 6,440,835 B1 * | 8/2002 | Lin ............................. 438/611 |
| 6,505,665 B1 | 1/2003 | Ulmer et al. ............... 156/556 |
| 6,577,012 B1 | 6/2003 | Greenwood et al. ...... 257/766 |
| 6,639,308 B1 * | 10/2003 | Crowley et al. ........... 257/676 |
| 6,943,434 B2 | 9/2005 | Tangpuz et al. ............ 257/666 |
| 2004/0089879 A1 * | 5/2004 | Lee et al. .................... 257/200 |
| 2004/0253763 A1 | 12/2004 | Punzalan et al. ........... 438/111 |
| 2005/0156291 A1 * | 7/2005 | Shiu et al. .................. 257/666 |
| 2006/0001134 A1 * | 1/2006 | Sun et al. .................. 257/676 |
| 2006/0012055 A1 * | 1/2006 | Foong et al. ............... 257/780 |

* cited by examiner

*Primary Examiner* — Wael Fahmy
*Assistant Examiner* — Sarah Salerno
(74) *Attorney, Agent, or Firm* — Mikio Ishimaru

(57) ABSTRACT

An integrated circuit package system is provided forming a lead finger from a padless lead frame, forming a lead tip hole in the lead finger, mounting an integrated circuit die having a solder bump on the lead finger, and reflowing the solder bump on the lead tip hole of the lead finger.

20 Claims, 3 Drawing Sheets

INTEGRATED CIRCUIT PACKAGE SYSTEM

TECHNICAL FIELD

The present invention relates generally to integrated circuit packages and more particularly to flip chip packages.

BACKGROUND ART

Modern consumer electronics, such as cellular phones, digital cameras, and music players, are packing more integrated circuits into an ever shrinking physical space with expectations for decreasing cost. Numerous technologies have been developed to meet these requirements. Some of the research and development strategies focus on new technologies while others focus on improving the existing and mature technologies. Research and development in the existing technologies may take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. Still the demand continues for lower cost, smaller size and more functionality. Continued integration of functions into a single integrated circuit increases the integrated circuit size necessitating a more expensive package, a higher profile package, or a higher pin count package, or a combination thereof.

A variation of existing technologies uses mature package technologies with lead fingers made from lead frames. However, lead frame packages typically use bond wires electrically connecting the lead fingers to the integrated circuit resulting in less than optimal package height or pin count or both. Another variation of existing technologies uses solder bumps on the integrated circuit with a flip chip mounting. However, the flip chip mounting requires reflow of the solder bumps often resulting in uneven solder flow, inconsistent connection to the package terminals, contamination from inadvertent flow, or a combination thereof. Yet another variation combines flip chip style mounting with lead frame packages. However, numerous manufacturing steps are required to create suitable solder reflow, or wettable, areas in the lead fingers resulting in increased complexity, reduced manufacturing yield, and increased cost.

Thus, a need still remains for a flip chip lead frame integrated circuit package system providing low cost, low profile, and high yield as well as providing robust electrical performance. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides forming a lead finger from a lead frame, forming a lead tip hole in the lead finger, mounting an integrated circuit die having a solder bump on the lead finger, and reflowing the solder bump on the lead tip hole of the lead finger.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1A:
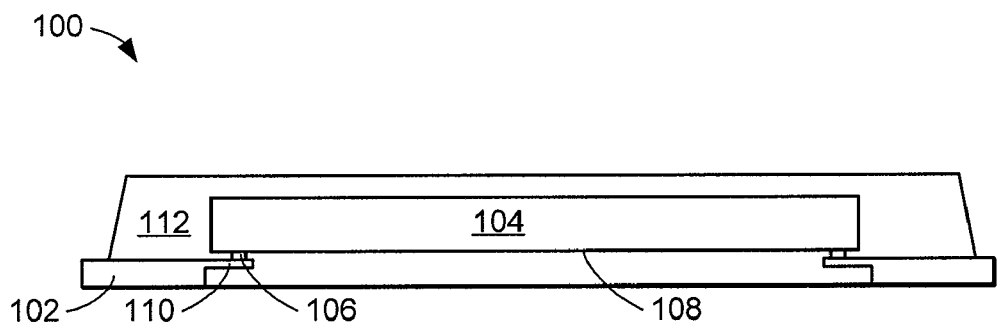
FIG. 1A is a cross-sectional view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Referring now to FIG. 1A, therein is shown a cross-sectional view of an integrated circuit package system 100 in an embodiment of the present invention. The integrated circuit package system 100 includes lead fingers 102 formed from a padless lead frame (not shown), an integrated circuit die 104 with electrical interconnects 106, such as solder bumps, attached to an active side 108 of the integrated circuit die 104. The integrated circuit die 104 is flip chip mounted with the electrical interconnects 106 on lead tips 110 of the lead fingers 102. The lead fingers 102 have a first thickness and the lead tips 110 have a second thickness wherein the first thickness is greater than the second thickness. A molding compound 112 encapsulates the integrated circuit die 104, the electrical interconnects 106, and the lead fingers 102.

The flip chip mounting eliminates wire loops required by bond wires reducing the height of the integrated circuit package system 100. The height may be further reduced by thinning the integrated circuit die 104. The integrated circuit package system 100 may support increased pin count or the pin density for higher input/output numbers from the integrated circuit die 104 by flip chip mounting and eliminating wire crossings found in wire bonding processes.

The integrated circuit package system 100 is a padless lead frame package eliminating paddle (not shown) delamination problems of the integrated circuit die 104 from with the molding compound 112, such as epoxy molding compound (EMC). The elimination of a delamination source improves the performance of the integrated circuit package system 100 in moisture level sensitivity (MSL) tests resulting in improved reliability.

For illustrative purpose, the integrated circuit package system 100 is shown as a single row of the lead fingers 102, although it is understood the number of rows of the lead fingers 102 may be more than one.

Figure 1B:
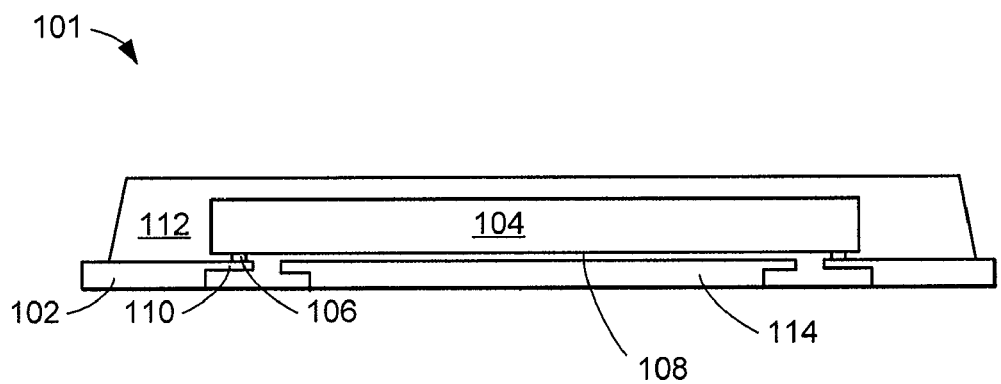
FIG. 1B is a cross-sectional view of an integrated circuit package system having a die paddle.

Referring now to FIG. 1B, therein is shown a cross-sectional view of an integrated circuit package system 101 having a die paddle 114. The integrated circuit package system 101 includes lead fingers 102 formed from a lead frame (not shown) having the die paddle 114, an integrated circuit die 104 with electrical interconnects 106, such as solder bumps, attached to an active side 108 of the integrated circuit die 104. The integrated circuit die 104 is flip chip mounted with the electrical interconnects 106 on lead tips 110 of the lead fingers 102 over the die paddle 114. A molding compound 112 encapsulates the integrated circuit die 104, the electrical interconnects 106, the lead fingers 102, and the die paddle 114.

The integrated circuit package system 101 is a lead frame package also eliminates delamination problems from the die paddle 114 with the integrated circuit die 104 since the integrated circuit die 104 is not attached to the die paddle 114. The elimination of a delamination source improves the performance of the integrated circuit package system 101 in moisture level sensitivity (MSL) tests resulting in improved reliability.

Figure 2:
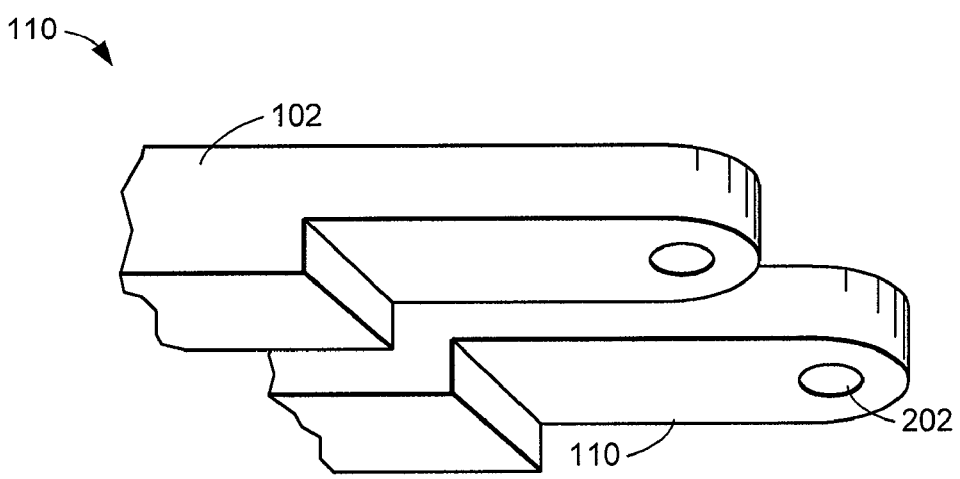
FIG. 2 is a schematic view of the lead tips.

Referring now to FIG. 2, therein is shown a schematic view of the lead tips 110. The lead tips 110 may be formed by half etching the bottom of the lead fingers 102 creating an elevated surface of the lead tips 110. The molding compound 112 may encapsulate and hermetically seal the lead tips 110 exposing the bottom surface of the lead fingers 102 for connection to the next system level (not shown), such as a printed circuit board.

A lead tip hole 202 may be formed by etching the lead tips 110 such that the lead tip hole 202 traverses through the lead tips 110. The etching process to form the lead tips 110 may be a continuation of the half etching forming the lead tips 110 without the need to change the surface thereby saving manufacturing steps and complexity. The lead tip hole 202 forms the wettable area for the reflow of the electrical interconnects 106 of FIG. 1A and FIG. 1B without creating additional structures thereby reducing the required thickness of the lead fingers 102 and the lead tips 110.

For illustrative purpose, the opening of the lead tip hole 202 is shown in a geometric shape, such as a circle, although it is understood that the opening may be a different geometric shape, as well. Also for illustrative purpose, the lead tip 202 is shown as a singular orifice, although it is understood that the lead tip hole 202 and the lead tips 110 may form other wettable areas that differ than a singular orifice, as well.

Figure 3:
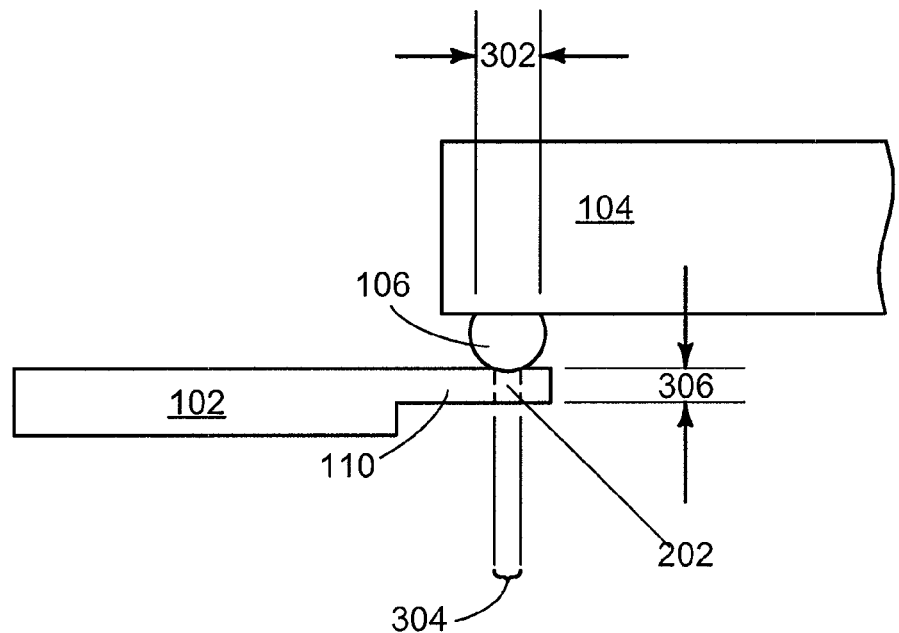
FIG. 3 is a more detailed cross-sectional view of one of the lead tips with the integrated circuit die.

Referring now to FIG. 3, therein is shown a more detailed cross-sectional view of one of the lead tips 110 with the integrated circuit die 104. The integrated circuit die 104 is on the lead fingers 102 with one of the electrical interconnects 106 on one of the lead tips 110 covering the lead tip hole 202.

A bump diameter 302 of the electrical interconnects 106 is represented by a variable $d_b$. A hole diameter 304 of the lead tip hole 202 is represented by a variable $d_h$. A tip thickness 306 of the lead tips 110 is represented by a variable t. Equation 1 represents the preferred range of the hole diameter 304 to the bump diameter 302 such that the lead tip hole 202 such that the lead tip hole 202 provides a wettable area for reliable electrical connection. The bump diameter 302 is larger than the hole diameter 304. Although it is understood that of the hole diameter 304 may be a percentage smaller than the bump diameter 302 that may not be in the range in equation 1.

$$10\% \ d_b \leq d_h \leq 50\% \ d_b \qquad (1)$$

Equation 2 represents the preferred range of the tip thickness 306 to the bump diameter 302 such that the electrical interconnects 106 provides sufficient electrical surface coverage for a reliable electrical connection. The bump diameter 302 is larger than the tip thickness 306. Although it is understood that the tip thickness 306 may be a different percentage to the bump diameter 302 than the range in equation 2.

$$20\% \ d_b \leq t \leq 60\% \ d_b \qquad (2)$$

Figure 4:
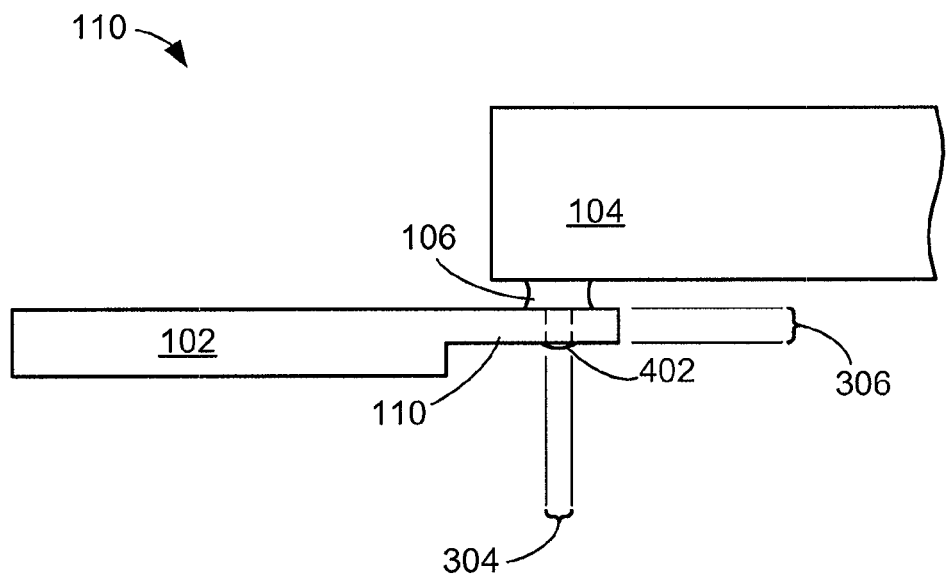
FIG. 4 is a more detailed cross-sectional view of one of the lead tips with the electrical interconnects reflowed.

Referring now to FIG. 4, therein is shown a more detailed cross-sectional view of one of the lead tips 110 with the electrical interconnect 106 reflowed. The integrated circuit die 104 on the lead fingers 102 undergoes reflow such that the electrical interconnects 106 collapse filling and coat the lead tip hole 202. The lead tip hole 202 prevents the material of the electrical interconnects 106 from inadvertent flow preventing contamination. Equation 1 and equation 2 represent the relative size and thickness ranges of the electrical interconnect 106 to the lead tip hole 202 and the lead tip 110, respectively, for reliable electrical connection. The tip thickness 306 and the hole diameter 304 along with the viscosity of the electrical interconnect 106 also form the surface tension such that the electrical interconnect 106 do not flow completely through the lead tip hole 202. 202 but extend through the lead tip hole 202 to form a bump 402 of the electrical interconnect 106 on the lead tip 110 opposite the integrated circuit die 104. The bump 402 is larger than the lead tin hole 202 and is thinner than the thickness of the lead finger 102.

Figure 5:
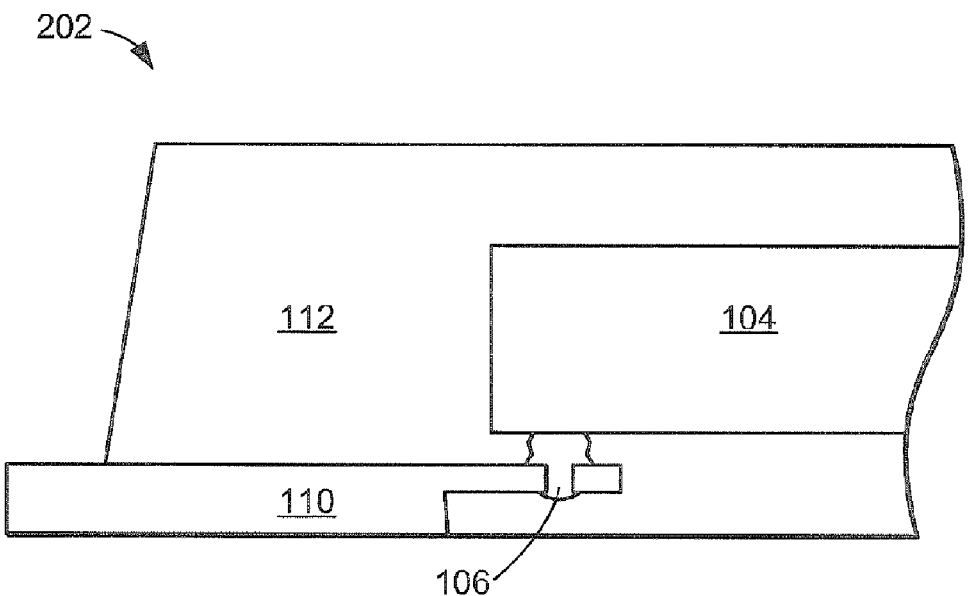
FIG. 5 is a more detailed cross-sectional view of the integrated circuit die on one of the lead tips of FIG. 4.

Referring now to FIG. 5, therein is shown a more detailed cross-sectional view of the integrated circuit die 104 on one of the lead tips 110 of FIG. 4. The electrical interconnects 106 in the lead tip hole 202 of the lead tips 110 also support and hold the integrated circuit die 104. The mechanical connections formed by the electrical interconnects 106 in the lead tips 110 hold the integrated circuit die 104 withstanding the encapsulation process of the molding compound 112.

Figure 6:
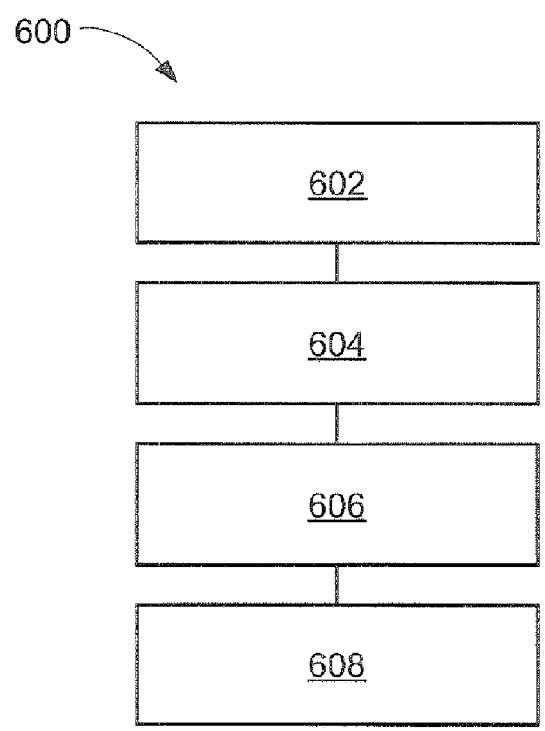
FIG. 6 is a flow chart of an integrated circuit package system for manufacture of the integrated circuit package in an embodiment of the present invention.

Referring now to FIG. 6, therein is shown a flow chart of an integrated circuit package system 600 for manufacture of the integrated circuit package in an embodiment of the present invention. The system 600 includes forming a lead finger from a lead frame in a block 602; forming a lead tip hole in the lead finger in a block 604; mounting an integrated circuit die having a solder bump on the lead finger in a block 606; and reflowing the solder bump on the lead tip hole of the lead finger in a block 608.

In greater detail, a method to fabricate the integrated circuit package system 100, according to an embodiment of the present invention, is performed as follows:

1. Forming the lead fingers 102 from a lead frame. (FIG. 1A and FIG. 1B)
2. Half etching the lead tips 110 of the lead fingers 102. (FIG. 2)
3. Etching the lead tip hole 202 in the lead tips 110. (FIG. 2)
4. Mounting the integrated circuit die 104 having the electrical interconnects 106 on the lead fingers 102. (FIG. 3)
5. Reflowing the electrical interconnects 106 on the lead tip hole 202 of the lead fingers 102. (FIG. 4)
6. Encapsulating the molding compound 112 around the integrated circuit die 104, the lead fingers 102, and the electrical interconnects 106. (FIG. 5)

It has been discovered that the present invention thus has numerous aspects.

It has been discovered that the integrated circuit package system for lead frame flip chip provides increased reliability, higher pin count, lower package height, and lower cost with simplified manufacturing.

An aspect is that the present invention is that the lead tip hole in the lead fingers simplifies creating wettable areas for the solder bump reflow. The lead tip hole along with the reflowed solder bump collectively support and hold the integrated circuit die withstanding the encapsulation process.

Another aspect of the present invention is that the lead tip hole size and depth relationship to the solder bump diameter keeps the solder bump to collapse and coat the lead tip hole without the solder material to completely flow through the lead tip hole. The lead tip hole directs the solder material flow to prevent inadvertent flow that may cause contamination.

Yet another aspect of the present invention is that the lead tip hole formation requires less etching or less number of different etching to create suitable wettable area for the solder bump reflow.

Yet another aspect of the present invention is that the padless lead frame package and the lead frame package having the die paddle, without an integrated circuit thereon, avoid problems common with packages with die paddle or with a die paddle with the integrated circuit thereon, such as paddle delamination with EMC.

Thus, it has been discovered that the lead frame flip chip integrated circuit package system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit package in packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A method for fabricating an integrated circuit package system comprising:

forming a lead finger having a first thickness and a lead tip having a second thickness wherein the first thickness is greater than the second thickness;

forming a lead tip hole through the lead tip;

mounting an integrated circuit die having a solder bump on the lead tip and having the lead tip hole in the range of 10% to 50% of a bump diameter of the solder bump and a lead tip thickness in the range of 20% to 60% of the bump diameter; and reflowing the solder bump to extend through the lead tip hole to form a bump of solder on the lead tip opposite the integrated circuit die, the bump of solder larger than the lead tip hole.

2. The method as claimed in claim 1 wherein forming the lead finger comprises forming the lead finger without a die paddle.

3. The method as claimed in claim 1 wherein forming the lead tip hole in the lead tip comprises forming a hole diameter of the lead tip hole smaller than a diameter of the solder bump.

4. The method as claimed in claim 1 wherein reflowing the solder bump on the lead tip hole leaves a portion of the solder bump on the lead tip wherein the integrated circuit die is supported above the lead tip during encapsulation of the integrated circuit die and the lead tip.

5. The method as claimed in claim 1 wherein forming the lead tip hole in the lead tip comprises forming a wettable area on the lead tip.

6. A method for fabricating an integrated circuit package system comprising:

forming lead fingers having a first thickness;

half etching to form lead tips of the lead fingers, the lead tips having a second thickness wherein the first thickness is greater than the second thickness;

etching lead tip holes through the lead tips;

mounting an integrated circuit die having solder bumps on the lead fingers and having the lead tip holes in the range of 10% to 50% of a bump diameter of the solder bump and a lead tip thickness in the range of 20% to 60% of the bump diameter; and reflowing solder bumps to extend through the lead tip holes to form bumps of solder on the lead tips opposite the integrated circuit die, the bumps of solder larger than the lead tip holes.

7. The method as claimed in claim 6 wherein forming the lead fingers includes a die paddle with the lead fingers around the die paddle.

8. The method as claimed in claim 6 wherein forming the lead fingers comprises forming a die paddle with the lead fingers.

9. The method as claimed in claim 6 further comprising forming an encapsulant around the integrated circuit die and the bumps of solder on the lead fingers.

10. The method as claimed in claim 6 wherein reflowing the solder bumps on the lead tip holes of the lead fingers comprises coating a surface of the lead tip holes with a material of the solder bumps.

11. An integrated circuit package system comprising:

a lead finger having a first thickness and a lead tip having a second thickness wherein the first thickness is greater than the second thickness, the lead tip having a lead tip hole provided therein; and an integrated circuit die having a solder bump on the lead tip, the solder bump extending through the lead tip hole to form a bump of solder on the lead tip opposite the integrated circuit die, the bump of solder larger than the lead tip hole, the lead tip having the lead tip hole in the range of 10% to 50% of a bump diameter of the solder bump and a lead tip thickness in the range of 20% to 60% of the bump diameter.

12. The system as claimed in claim 11 wherein the lead finger is formed without a die paddle.

13. The system as claimed in claim 11 wherein the lead tip hole has a hole diameter smaller than a diameter of the solder bump.

14. The system as claimed in claim 11 wherein the solder bump on the lead tip hole has a portion of the solder bump on the lead tip wherein the integrated circuit die is supported above the lead tip for encapsulation of the integrated circuit die and the lead tip.

15. The system as claimed in claim 11 wherein the lead tip hole in the lead tip has a wettable area on the lead tip.

16. The system as claimed in claim 11 further comprising additional lead fingers.

17. The system as claimed in claim 16 wherein the lead fingers are around a die paddle.

18. The system as claimed in claim 16 wherein the bump of solder is larger than the lead tip hole.

19. The system as claimed in claim 16 further comprising an encapsulant around the integrated circuit die and the bumps of solder on the lead fingers.

20. The system as claimed in claim 16 further comprising an encapsulant coplanar with surfaces of the lead fingers.

\* \* \* \* \*